United States Patent
Tsai

(10) Patent No.: US 9,366,959 B2
(45) Date of Patent: Jun. 14, 2016

(54) NEGATIVE PHOTOSENSITIVE RESIN COMPOSITION AND APPLICATION THEREOF

(71) Applicant: Chi Mei Corporation, Tainan (TW)

(72) Inventor: Yu-Jie Tsai, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 14/450,295

(22) Filed: Aug. 4, 2014

(65) Prior Publication Data

US 2015/0044790 A1    Feb. 12, 2015

(30) Foreign Application Priority Data

Aug. 8, 2013   (TW) .............................. 102128521 A

(51) Int. Cl.
*G03F 7/038* (2006.01)
*G03F 7/20* (2006.01)
(Continued)

(52) U.S. Cl.
CPC .............. *G03F 7/038* (2013.01); *G03F 7/0045* (2013.01); *G03F 7/40* (2013.01); *H01L 27/3246* (2013.01)

(58) Field of Classification Search
None
See application file for complete search history.

(56) References Cited

U.S. PATENT DOCUMENTS 5,773,200 A * 6/1998 Okazaki ................ G03F 7/0226
430/191
6,110,641 A * 8/2000 Trefonas et al. ........... 430/270.1

(Continued)

FOREIGN PATENT DOCUMENTS

CN   102759858   * 10/2012
JP   2001-089533  * 4/2001
(Continued)

OTHER PUBLICATIONS

"Office Action of Taiwan Counterpart Application", issued on Oct. 22, 2014, p.1-p.3.

*Primary Examiner* — Martin Angebranndt
(74) *Attorney, Agent, or Firm* — Jianq Chyun IP Office

(57) ABSTRACT

A negative photosensitive resin composition including an alkali-soluble resin (A), a photoacid generator (B), a basic compound (C), a cross-linking agent (D), and a solvent (E) is provided. The alkali-soluble resin (A) includes an acrylate resin (A-1) and a novolac resin (A-2). The acrylate resin (A-1) is synthesized by polymerizing a monomer for polymerization, wherein the monomer for polymerization includes an unsaturated carboxylic acid or unsaturated carboxylic acid anhydride monomer (a-1-1) and a monomer (a-1-2). The monomer (a-1-2) includes a compound (a-1-2-1) with a tri-cyclodecane or dicyclopentadiene structure, a compound (a-1-2-2) represented by formula (1), or a combination of both. The novolac resin (A-2) is synthesized by polymerizing an aldehyde compound with an aromatic hydroxy compound, wherein the aromatic hydroxy compound includes a xylenol compound.

Formula (1)

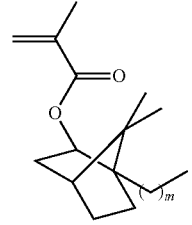

13 Claims, 4 Drawing Sheets

(51) Int. Cl.
  *G03F 7/027* (2006.01)
  *G03F 7/004* (2006.01)
  *G03F 7/40* (2006.01)
  *H01L 27/32* (2006.01)

(56) References Cited

U.S. PATENT DOCUMENTS

| | | | |
|---|---|---|---|
| 2007/0228936 A1* | 10/2007 | Kim | 313/503 |
| 2008/0180363 A1* | 7/2008 | Jeong et al. | 345/76 |
| 2011/0073837 A1* | 3/2011 | Zhou et al. | 257/13 |
| 2012/0162575 A1* | 6/2012 | Lin et al. | 349/62 |
| 2013/0021543 A1* | 1/2013 | Lin et al. | 349/12 |
| 2013/0245150 A1* | 9/2013 | Tsai et al. | 522/39 |
| 2014/0051017 A1* | 2/2014 | Hsieh et al. | 430/18 |
| 2014/0087307 A1* | 3/2014 | Chen et al. | 430/280.1 |
| 2014/0087308 A1* | 3/2014 | Chen et al. | 430/280.1 |
| 2014/0255845 A1* | 9/2014 | Tsai | 430/280.1 |
| 2014/0363915 A1* | 12/2014 | Tsai | 438/46 |
| 2015/0072275 A1* | 3/2015 | Liu et al. | 430/18 |

FOREIGN PATENT DOCUMENTS

| | | |
|---|---|---|
| JP | 3320397 | 9/2002 |
| TW | 201224662 | 6/2012 |

* cited by examiner

NEGATIVE PHOTOSENSITIVE RESIN COMPOSITION AND APPLICATION THEREOF

CROSS-REFERENCE TO RELATED APPLICATION

This application claims the priority benefit of Taiwan application serial no. 102128521, filed on Aug. 8, 2013. The entirety of the above-mentioned patent application is hereby incorporated by reference herein and made a part of this specification.

FIELD OF THE INVENTION

The invention relates to a photosensitive resin composition. More particularly, the invention relates to a negative photosensitive resin composition.

DESCRIPTION OF RELATED ART

In recent years, with developments of semiconductor industry, liquid crystal displays (LCD) and organic electro-luminescence display (OELD) devices, accompanied by demands for miniaturization in size of devices, photolithography has become a very important manufacturing process under discussion. In a photolithography process, all required patterns must be finer so as to achieve the objective of size miniaturization.

Generally speaking, in a semiconductor process, a metallic pattern may be fabricated using a lift-off method. Steps of the lift-off method are as follows. First, a photoresist pattern is formed on a substrate. Next, a metal layer is evaporated on the substrate having the photoresist pattern formed thereon. Finally, the photoresist pattern and the metal layer formed on the photoresist pattern are removed, so as to form the metallic pattern. In the lift-off method, since a cross-section of the photoresist pattern is in a reversed tapered shape, the metal layer on the substrate and the metal layer on the photoresist pattern are not continuous, and thus may be easily removed. It is worth noting that the aforementioned photoresist pattern has problems such as poor heat resistance and high water absorption.

Meanwhile, in an OELD device, the photoresist pattern generally serves as a rib on a first electrode layer. Furthermore, an organic electro-luminescence matrix is coated on the first electrode layer exposed by the rib, thereby forming a pixel layer. Next, a metal layer is evaporated on entire surfaces of the rib and the pixel layer, thereby forming a second electrode layer on the pixel layer. It is worth noting that since organic light emitting devices may be easily damaged by water, solvent and so on, the rib is preferably made of a material that has low water absorption. In addition, in order to remove the water and solvent remaining in the rib, generally, the rib and other organic light emitting devices are subjected to a deaeration treatment at a high temperature. However, as a result, the rib is deformed and thus unfavorable for use.

Japanese Patent No. 3320397 discloses a method for forming a photoresist pattern in a reversed tapered shape, wherein a bisphenol compound serves as a negative photosensitive resin composition, and the negative photosensitive resin composition is used for fainting the photoresist pattern. Accordingly, a metallic pattern may be formed on the photoresist pattern by evaporation, and the photoresist pattern forms a rib having good heat resistance and low water absorption. Nonetheless, the photoresist pattern formed by the aforementioned negative photosensitive resin composition has problems such as poor stripping property with the substrate and a poor tolerance to the evaporation process.

Therefore, a negative photosensitive resin composition suitable for forming a photoresist pattern having good stripping property with the substrate and good tolerance to the evaporation process.

SUMMARY OF THE INVENTION

The invention provides a negative photosensitive resin composition configured to form a photoresist pattern having good stripping property with a substrate and good tolerance to the evaporation process.

The invention provides a negative photosensitive resin composition including an alkali-soluble resin (A), a photoacid generator (B), a basic compound (C), a cross-linking agent (D), and a solvent (E). The alkali-soluble resin (A) includes an acrylate resin (A-1) and a novolac resin (A-2). It should be noted that the acrylate resin (A-1) is synthesized by polymerizing a monomer for polymerization, wherein the monomer for polymerization includes an unsaturated carboxylic acid or unsaturated carboxylic acid anhydride monomer (a-1-1) and a monomer (a-1-2). The monomer (a-1-2) includes a compound (a-1-2-1) with a tricyclodecane or dicyclopentadiene structure, a compound (a-1-2-2) represented by formula (1), or a combination of both. The novolac resin (A-2) is synthesized by polymerizing an aldehyde compound with an aromatic hydroxy compound, wherein the aromatic hydroxy compound includes a xylenol compound.

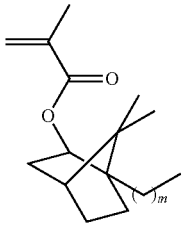

Formula (1)

In formula (1), m is an integer of 0 to 2.

In an embodiment of the invention, the monomer for polymerization of the acrylate resin (A-1) further includes a monomer (a-1-3) having a hydroxy group.

In an embodiment of the invention, the photoacid generator (B) includes an onium salt compound, a halogen-containing compound, a sulfone compound, a sulfonic acid compound, a sulfonimide compound, or a combination thereof.

In an embodiment of the invention, the basic compound (C) includes an aliphatic primary amine, an aliphatic secondary amine, an aliphatic tertiary amine, an amino alcohol, an aromatic amine, a quaternary ammonium hydroxide, an alicyclic amine, or a combination thereof.

In an embodiment of the invention, based on 100 parts by weight of the alkali-soluble resin (A), a used amount of the photoacid generator (B) is 0.5 to 6 parts by weight, a used amount of the basic compound (C) is 0.3 to 3 parts by weight, a used amount of the cross-linking agent (D) is 5 to 35 parts by weight, and a used amount of the solvent (E) is 100 to 1000 parts by weight.

In an embodiment of the invention, based on a total used amount of 100 parts by weight of the acrylate resin (A-1) and the novolac resin (A-2) being 100 parts by weight, a used amount of the acrylate resin (A-1) is 10 to 70 parts by weight, and a used amount of the novolac resin (A-2) is 30 to 90 parts by weight.

The invention also provides a method for forming a photoresist pattern including the following steps. First, the negative photosensitive resin composition is coated on a substrate. Next, a processing step is performed to the negative photosensitive resin composition, so as to form a photoresist pattern.

In an embodiment of the invention, the photoresist pattern is a rib.

The invention also provides a method for forming a metallic pattern including the following steps. First, the photoresist pattern is formed on a substrate. Next, a metal layer is formed on the substrate and on the photoresist pattern. Finally, the photoresist pattern and the metal layer on the photoresist pattern are removed, so as to form a metallic pattern.

The invention also provides a method for fabricating a light emitting diode grain including the following steps. First, a semiconductor layer is formed on a substrate. Next, a metallic pattern is formed on at least one side of the semiconductor layer so as to serve as an electrode layer, wherein the metallic pattern is formed by the aforementioned method for forming a metallic pattern.

The invention provides a method for fabricating an organic light emitting diode display device including the following steps. First, a first electrode layer is formed on a substrate. Next, the negative photosensitive resin composition is coated on the substrate. Then, a processing step is performed to the negative photosensitive resin composition, so as to form a rib. Next, an organic layer is formed within a region defined by the rib. Finally, a second electrode layer is formed on the organic layer.

Based on the above, the negative photosensitive resin composition of the invention includes the acrylate resin (A-1), the novolac resin (A-2), and the basic compound (C). The monomer for polymerization of the acrylate resin (A-1) includes the compound (a-1-2-1) with a tricyclodecane or dicyclopentadiene structure, or the compound (a-1-2-2) represented by formula (1). Moreover, a monomer for polycondensation of the novolac resin (A-2) includes a xylenol compound. Accordingly, the problems of photoresist patterns having poor stripping property with the substrate and poor tolerance to the evaporation process when conventional negative photosensitive resin compositions are used as the photoresist patterns are effectively improved.

To make the above features and advantages of the invention more comprehensible, embodiments accompanied with drawings are described in detail as follows.

DETAILED DESCRIPTION OF DISCLOSED EMBODIMENTS

Preparation of Negative Photosensitive Resin Composition

Figure 1A:
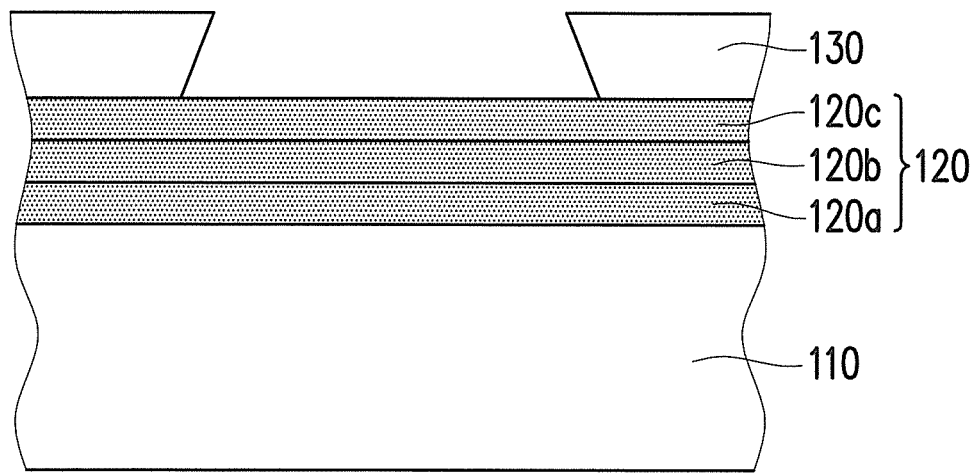
FIGS. 1A to 1C are schematic diagrams of a method for fabricating a light emitting diode grain according to an embodiment of the invention.

The invention provides a negative photosensitive resin composition including an alkali-soluble resin (A), a photo-acid generator (B), a basic compound (C), a cross-linking agent (D), and a solvent (E). In addition, the negative photosensitive resin composition further includes an additive (F) as needed. Components of the negative photosensitive resin composition utilized in the invention are respectively described in detail hereinafter.

Alkali-Soluble Resin (A)

The alkali-soluble resin (A) includes an acrylate resin (A-1) and a novolac resin (A-2). The acrylate resin (A-1) and the novolac resin (A-2) are described in detail as follows:

Acrylate Resin (A-1)

The acrylate resin (A-1) is synthesized by polymerizing a monomer for polymerization in a solvent in the presence of a polymerization initiator, wherein the monomer for polymerization includes an unsaturated carboxylic acid or unsaturated carboxylic acid anhydride monomer (a-1-1) and a monomer (a-1-2). Moreover, the monomer (a-1-2) includes a compound (a-1-2-1) with a tricyclodecane or dicyclopentadiene structure, a compound (a-1-2-2) represented by formula (1), or a combination of both. In addition, the monomer for polymerization further includes a monomer (a-1-3) having a hydroxy group or other monomer (a-1-4). The aforementioned monomers are described as follows:

Unsaturated Carboxylic Acid or Unsaturated Carboxylic Acid Anhydride Monomer (a-1-1)

The unsaturated carboxylic acid or unsaturated carboxylic acid anhydride compound (a-1-1) refers to a compound containing a carboxylic acid group or carboxylic acid anhydride structure and having an unsaturated bond. The unsaturated carboxylic acid or unsaturated carboxylic acid anhydride compound (a-1-1) includes an unsaturated monocarboxylic acid compound, an unsaturated dicarboxylic acid compound, an unsaturated anhydride compound, a polycyclic unsaturated carboxylic acid compound, a polycyclic unsaturated dicarboxylic acid compound, a polycyclic unsaturated anhydride compound, or a combination thereof.

Specific examples of the unsaturated monocarboxylic acid compound include (meth)acrylic acid, fumaric acid, α-chloroacrylic acid, ethylacrylic acid, cinnamic acid, 2-(meth)acryloyl oxyethyl succinate, 2-(meth)acryloyl oxyethyl hexahydrophthalic acid ester, 2-(meth)acryloyl oxyethyl phthalic acid ester, (ω)-carboxy polycaprolactone monoacrylate (trade name: ARONIX M-5300; manufactured by Toagosei Company, Limited), or a combination thereof.

Specific examples of the unsaturated dicarboxylic acid compound include maleic acid, fumaric acid, methylfumaric acid, itaconic acid, citraconic acid, an anhydride compound of the unsaturated dicarboxylic acid compound (i.e. unsaturated anhydride compound), or a combination thereof.

Specific examples of the polycyclic unsaturated carboxylic acid compound include 5-carboxy bicyclo[2.2.1]hept-2-ene, 5-carboxy-5-methyl bicyclo[2.2.1]hept-2-ene, 5-carboxy-5-ethyl bicyclo[2.2.1]hept-2-ene, 5-carboxy-6-methyl bicyclo[2.2.1]hept-2-ene or 5-carboxy-6-ethyl bicyclo[2.2.1]hept-2-ene or the like, or a combination thereof.

Specific examples of the polycyclic unsaturated dicarboxylic acid compound include 5,6-dicarboxybicyclo[2.2.1]hept-2-ene.

Specific examples of the polycyclic unsaturated dicarboxylic acid anhydride compound include an anhydride compound of the polycyclic unsaturated dicarboxylic acid compound.

Preferred examples of the unsaturated carboxylic acid or unsaturated carboxylic acid anhydride compound (a-1-1) are methacrylic acid, maleic anhydride, 2-methacryloyl oxyethyl succinate, or a combination thereof.

The unsaturated carboxylic acid or unsaturated carboxylic acid anhydride compound (a-1-1) may be used alone or in multiple combinations.

Based on 100 parts by weight of the monomer used in the polymerization of the acrylate resin (A-1), a used amount of the unsaturated carboxylic acid or unsaturated carboxylic acid anhydride compound (a-1-1) is 5 to 40 parts by weight, preferably 10 to 35 parts by weight, and more preferably 10 to 30 parts by weight.

Monomer (a-1-2)
Compound (a-1-2-1) with Tricyclodecane or Dicyclopentadiene Structure The compound (a-1-2-1) with a tricyclodecane or dicyclopentadiene structure includes a compound with a tricyclodecane skeleton or a dicyclopentadiene skeleton. Moreover, the aforementioned compound has an unsaturated bond.

Specific examples of the compound (a-1-2-1) with a tricyclodecane or dicyclopentadiene structure include dicyclopentanyl(meth)acrylate, dicyclopentenyl(meth)acrylate, dicyclopentanyloxyethyl(meth)acrylate, dicyclopentenyloxyethyl(meth)acrylate or the like. Here, (meth)acrylate means acrylate or methacrylate.

Preferred examples of the compound (a-1-2-1) with a tricyclodecane or dicyclopentadiene structure are dicyclopentanyl methacrylate, dicyclopentenyl acrylate, dicyclopentanyloxyethyl methacrylate, or a combination thereof.

The compound (a-1-2-1) with a tricyclodecane or dicyclopentadiene structure may be used alone or in multiple combinations.

Compound (a-1-2-2) Represented by Formula (1)

The compound (a-1-2-2) represented by formula (1) is as follows:

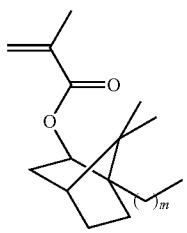

Formula (1)

In formula (1), m is an integer of 0 to 2.

Specific examples of the compound (a-1-2-2) represented by formula (1) include isobornyl(meth)acrylate, 1,7,7-trimethyl bicyclo[2.2.1]heptane-2-yl(meth)acrylate, 7,7-dimethyl-1-propyl bicyclo[2.2.1]heptane-2-yl(meth)acrylate, 1-ethyl-7,7-dimethyl bicyclo[2.2.1]heptane-2-yl(meth)acrylate or the like.

Preferred examples of the compound (a-1-2-2) represented by formula (1) are isobornyl(meth)acrylate, 1-ethyl-7,7-dimethyl bicyclo[2.2.1]heptane-2-yl(meth)acrylate, 7,7-dimethyl-1-propyl bicyclo[2.2.1]heptane-2-yl(meth)acrylate, or a combination thereof.

The compound (a-1-2-2) represented by formula (1) may be used alone or in multiple combinations.

Based on 100 parts by weight of the monomer used in the polymerization of the acrylate resin (A-1), a used amount of the compound (a-1-2-1) with a tricyclodecane or dicyclopentadiene structure, the compound (a-1-2-2) represented by formula (1), or a combination of both is 10 to 60 parts by weight, preferably 15 to 55 parts by weight, and more preferably 20 to 55 parts by weight.

It is worth noting that both the compound (a-1-2-1) with a tricyclodecane or dicyclopentadiene structure and the compound (a-1-2-2) represented by formula (1) have an aliphatic ring structure, so that heat resistance and glass transition temperature (Tg) of the acrylate resin (A-1) are effectively increased. Thus, the photoresist patterns has good tolerance to the evaporation process. In the event that none of the monomer for polymerization includes the compound (a-1-2-1) with a tricyclodecane or dicyclopentadiene structure or the monomer (a-1-2), the photoresist patterns has poor tolerance to the evaporation process.

Monomer (a-1-3) Having Hydroxy Group

The monomer (a-1-3) having a hydroxy group is, for example, hydroxyalkyl(meth)acrylate and hydroxyalkyl(meth)acrylamide. Specific examples of the hydroxyalkyl(meth)acrylate include 2-hydroxyethyl(meth)acrylate, 2-hydroxypropyl(meth)acrylate, 3-hydroxypropyl(meth)acrylate, 2-hydroxybutyl(meth)acrylate, 3-hydroxybutyl(meth)acrylate, or 4-hydroxybutyl(meth)acrylate. Specific examples of the hydroxyalkyl(meth)acrylamide include N-methylol acrylamide, N-ethylol acrylamide, N-ethylol methacrylamide or the like, or a combination thereof.

Preferred examples of the monomer (a-1-3) having a hydroxy group are 2-hydroxyethyl methacrylate, 2-hydroxypropyl(meth)acrylate, 3-hydroxypropyl methacrylate, N-methylol acrylamide, or a combination thereof.

The monomer (a-1-3) having a hydroxy group may be used alone or in multiple combinations. Based on 100 parts by weight of the monomer used in the polymerization of the acrylate resin (A-1), a used amount of the monomer (a-1-3) having a hydroxy group is 0 to 30 parts by weight, preferably 5 to 25 parts by weight, and more preferably 5 to 20 parts by weight.

It is worth noting that since the hydroxy group (—OH) in the monomer (a-1-3) having a hydroxy group increases the solubility of the photoresist pattern formed by the negative photosensitive resin composition in a stripping liquid, the stripping property of the photoresist pattern with a substrate is effectively enhanced.

Other Monomer (a-1-4)

The monomer for polymerization of the acrylate resin (A-1) further includes other monomer (a-1-4). The other monomer (a-1-4) includes an (meth)acrylate compound containing epoxy group, an α-alkyl acrylate compound containing epoxy group, a glycidyl ether compound, alkyl(meth)acrylate, alicyclic(meth)acrylate, aryl(meth)acrylate, unsaturated dicarboxylic acid diester, polyether(meth)acrylate or an aromatic vinyl compound.

Specific examples of the (meth)acrylate compound containing epoxy group include glycidyl(meth)acrylate, 2-methylglycidyl(meth)acrylate, 3,4-epoxybutyl(meth)acrylate, 6,7-epoxyheptyl(meth)acrylate, 3,4-epoxycyclohexyl(meth)acrylate or 3,4-epoxycyclohexylmethyl(meth)acrylate or the like, or a combination thereof.

Specific examples of the α-alkyl acrylate compound containing epoxy group include α-glycidyl ethyl acrylate, α-n-propyl glycidyl acrylate, α-n-butyl glycidyl acrylate, 6,7-epoxyheptyl α-ethyl acrylate or the like, or a combination thereof.

Specific examples of the glycidyl ether compound include o-vinylbenzylglycidylether, m-vinylbenzylglycidylether, p-vinylbenzylglycidylether or the like, or a combination thereof.

Specific examples of the alkyl(meth)acrylate include methyl(meth)acrylate, ethyl(meth)acrylate, n-propyl(meth)acrylate, iso-propyl(meth)acrylate, n-butyl(meth)acrylate, iso-butyl(meth)acrylate, s-butyl(meth)acrylate, t-butyl (meth)acrylate or the like, or a combination thereof.

Specific examples of the alicyclic(meth)acrylate include cyclohexyl(meth)acrylate, 2-methyl cyclohexyl(meth)acrylate, tetrahydrofurfuryl(meth)acrylate or the like, or a combination thereof.

Specific examples of the aryl(meth)acrylate include benzyl methacrylate, phenyl(meth)acrylate or the like, or a combination thereof.

Specific examples of the unsaturated dicarboxylic acid diester include diethyl maleate, diethyl fumarate, diethyl itaconate or the like, or a combination thereof.

Specific examples of the polyether(meth)acrylate include polyethylene glycol mono(meth)acrylate, polypropylene glycol mono(meth)acrylate or the like, or a combination thereof.

Specific examples of the aromatic vinyl compound include styrene, α-methyl styrene, m-methyl styrene, p-methyl styrene, p-methoxystyrene or the like, or a combination thereof.

Specific examples of the other monomer (a-1-4) further include acrylonitrile, methacrylonitrile, vinyl chloride, vinylidene chloride, acrylamide, methacrylamide, vinyl acetate, 1,3-butadiene, isoprene, 2,3-dimethyl-1,3-butadiene, N-cyclohexyl maleimide, N-phenyl maleimide, N-benzyl maleimide, N-succinimidyl-3-maleimidobenzoate, N-succinimidyl-4-maleimidobutyrate, N-succinimidyl-6-maleimidocaproate, N-succinimidyl-3-maleimidopropionate or N-(9-acridinyl)maleimide.

Preferred examples of the other monomer (a-1-4) are benzyl methacrylate, 1,3-butadiene, styrene, or a combination thereof.

The other monomer (a-1-4) may be used alone or in multiple combinations.

Based on 100 parts by weight of the monomer used in the polymerization of the acrylate resin (A-1), a used amount of the other monomer (a-1-4) is 0 to 55 parts by weight, preferably 5 to 50 parts by weight, and more preferably 10 to 50 parts by weight.

Examples of the solvent for preparing the acrylate resin (A-1) include alcohol, ether, ethylene glycol alkyl ether, ethylene glycol alkyl ether acetate, diethylene glycol alkyl ether, dipropylene glycol alkyl ether, propylene glycol monoalkyl ether, propylene glycol alkyl ether acetate, propylene glycol alkyl ether propionate, aromatic hydrocarbon, ketone or ester.

Specific examples of the alcohol include methyl alcohol, ethyl alcohol, benzyl alcohol, 2-phenylethanol, 3-phenyl-1-propanol or the like. Specific examples of the ether include tetrahydrofuran or the like. Specific examples of the ethylene glycol alkyl ether include ethylene glycol monopropyl ether, ethylene glycol monomethyl ether, ethylene glycol monoethyl ether or the like.

Specific examples of the ethylene glycol alkyl ether acetate include ethylene glycol butyl ether acetate, ethylene glycol ethyl ether acetate, ethylene glycol methyl ether acetate or the like. Specific examples of the diethylene glycol alkyl ether include diethylene glycol monomethyl ether, diethylene glycol monoethyl ether, diethylene glycol monobutyl ether, diethylene glycol dimethyl ether, diethylene glycol diethyl ether, diethylene glycol ethyl methyl ether or the like. Specific examples of the dipropylene glycol alkyl ether include dipropylene glycol monomethyl ether, dipropylene glycol monoethyl ether, dipropylene glycol dimethyl ether, dipropylene glycol diethyl ether, and dipropylene glycol ethyl methyl ether.

Specific examples of the propylene glycol monoalkyl ether include propylene glycol monomethyl ether, propylene glycol monoethyl ether, propylene glycol monopropyl ether, propylene glycol monobutyl ether or the like. Specific examples of the propylene glycol alkyl ether acetate include propylene glycol methyl ether acetate, propylene glycol ethyl ether acetate, propylene glycol propyl ether acetate, propylene glycol butyl ether acetate or the like. Specific examples of the propylene glycol alkyl ether propionate include propylene glycol methyl ether propionate, propylene glycol ethyl ether propionate, propylene glycol propyl ether propionate, propylene glycol butyl ether propionate or the like. Specific examples of the aromatic hydrocarbon include toluene, xylene or the like. Specific examples of the ketone include methyl-ethyl ketone, cyclohexanone, diacetone alcohol or the like.

Specific examples of the ester include methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutyrate, methyl methoxyacetate, ethyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, 3-methoxybutyl acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate or the like.

A preferred example of the solvent for preparing the acrylate resin (A-1) is diethylene glycol dimethyl ether or propylene glycol monomethyl ether acetate.

The solvent for preparing the acrylate resin (A-1) may be used alone or in multiple combinations.

The polymerization initiator for preparing the acrylate resin (A-1) is, for example, an azo compound or a peroxide. Specific examples of the azo compound include 2,2'-azobisisobutyronitrile, 2,2'-azobis(2,4-dimethylvaleronitrile), 2,2'-azobis(4-methoxyl-2,4-dimethylvaleronitrile), 2,2'-azobis(2-methylbutyronitrile), 4,4'-azobis(4-cyanopentanoic acid), dimethyl-2,2'-azobis(2-methylpropionate), 2,2'-azobis (2,4-dimethylvaleronitrile) or the like. Specific examples of the peroxide include benzoyl peroxide, lauroyl peroxide, tert-butyl peroxypivalate, 1,1-bis(tert-butylperoxy)cyclohexane, hydrogen peroxide or the like.

Preferred examples of the polymerization initiator for preparing the acrylate resin (A-1) are 2,2'-azobis(2-methylbutyronitrile), 2,2'-azobis(2,4-dimethylvaleronitrile), or a combination thereof.

The polymerization initiator for preparing the acrylate resin (A-1) may be used alone or in multiple combinations.

The acrylate resin (A-1) has a weight average molecular weight of 2,000 to 20,000, preferably 4,000 to 18,000, and more preferably 6,000 to 15,000.

Based on a total used amount of the acrylate resin (A-1) and the novolac resin (A-2) being 100 parts by weight, a used amount of the acrylate resin (A-1) is 10 to 70 parts by weight, preferably 15 to 65 parts by weight, and more preferably 20 to 60 parts by weight.

It is worth noting that in the event that the acrylate resin (A-1) is not employed, the photoresist pattern formed by the negative photosensitive resin composition has poor stripping property with the substrate and poor tolerance to the evaporation process.

Novolac Resin (A-2)

The novolac resin (A-2) is obtained by polymerization of an aldehyde compound with an aromatic hydroxy compound in the presence of an acid catalyst. The aromatic hydroxy compound includes a cresol compound (a-2-1), a xylenol compound (a-2-2) or the like.

Specific examples of the aldehyde compound include formaldehyde, paraformaldehyde, trioxane, acetaldehyde, propionaldehyde, butyraldehyde, trimethylacetaldehyde, acrolein, crotonaldehyde, cyclohexanecarbaldehyde, furfural, furylacrolein, benzaldehyde, terephthal aldehyde, phenylacetaldehyde, α-phenylpropionaldehyde, β-phenylpropionaldehyde, o-tolualdehyde, m-tolualdehyde, p-tolualdehyde, o-chlorobenzaldehyde, m-chlorobenzaldehyde, p-chlorobenzaldehyde, cinnamaldehyde or the like, or a combination thereof. Preferred examples of the aldehyde compound are formaldehyde, benzaldehyde, or a combination of both. The aldehyde compound may be used alone or in multiple combinations. Based on a used amount of the aromatic hydroxy compound used in the polymerization of the novolac resin (A-2) being 1 mol, a used amount of the aldehyde compound is 0.2 to 1.4 mol, preferably 0.25 to 1.3 mol, and more preferably 0.3 to 1.2 mol.

Specific examples of the cresol compound (a-2-1) include cresols such as o-cresol, m-cresol, p-cresol or the like. The cresol compound (a-2-1) may be used alone or in multiple combinations. Based on a used amount of the aromatic hydroxy compound used in the polymerization of the novolac resin (A-2) being 1 mol, a used amount of the cresol compound (a-2-1) is 0.5 to 0.97 mol, preferably 0.55 to 0.97 mol, and more preferably 0.6 to 0.97 mol.

Specific examples of the xylenol compound (a-2-2) include 2,3-xylenol, 2,5-xylenol, 3,5-xylenol, 3,4-xylenol, or a combination thereof. Preferred examples of the xylenol compound (a-2-2) are 2,5-xylenol, 3,5-xylenol, 3,4-xylenol, or a combination thereof. The xylenol compound (a-2-2) may be used alone or in multiple combinations. Based on a used amount of the aromatic hydroxy compound used in the polymerization of the novolac resin (A-2) being 1 mol, a used amount of the xylenol compound (a-2-2) is 0.03 to 0.5 mol, preferably 0.03 to 0.45 mol, and more preferably 0.03 to 0.4 mol.

It is worth noting that since the xylenol compound effectively enhances the heat resistance of the novolac resin (A-2), in the event that a monomer for polycondensation of the novolac resin (A-2) does not contain the xylenol compound (a-2-2), the photoresist pattern formed by the negative photosensitive resin composition has poor tolerance to the evaporation process. In addition, in the event that the novolac resin (A-2) is not employed, the photoresist pattern formed by the negative photosensitive resin composition has poor stripping property with the substrate and poor tolerance to the evaporation process.

Specific examples of the acid catalyst include hydrochloric acid, sulfuric acid, methanoic acid, acetic acid, oxalic acid, p-toluenesulfonic acid or the like, or a combination thereof. A preferred example of the acid catalyst is oxalic acid.

Based on a used amount of the aromatic hydroxy compound used in the polymerization of the novolac resin (A-2) being 1 mol, a used amount of the acid catalyst is 0.005 to 0.05 mol, preferably 0.007 to 0.045 mol, and more preferably 0.01 to 0.04 mol.

The novolac resin (A-2) has a weight average molecular weight of 1,000 to 12,000, preferably 1,500 to 10,000, and more preferably 2,000 to 8,000.

Based on a total used amount of the acrylate resin (A-1) and the novolac resin (A-2) being 100 parts by weight, a used amount of the novolac resin (A-2) is 30 to 90 parts by weight, preferably 35 to 85 parts by weight, and more preferably 40 to 80 parts by weight.

Other Alkali-Soluble Resin (A-3)

On a premise that the aforementioned objectives can be achieved, the alkali-soluble resin (A) of the negative photosensitive resin composition of the invention further includes other alkali-soluble resin (A-3). The other alkali-soluble resin (A-3) includes fluorene-based resin or urethane-based resin.

Specific examples of the fluorene-based resin include V259ME, V259MEGTS, V500MEGT (manufactured by Nippon Steel Chemical) or the like, or a combination thereof.

Specific examples of the urethane-based resin include UN-904, UN-952, UN-333, UN1255 (manufactured by Negami Chemical Industrial Co., Ltd.) or the like, or a combination thereof.

Preferred examples of the other alkali-soluble resin (A-3) are V259ME, UN-904, or a combination of both.

The other alkali-soluble resin (A-3) may be used alone or in multiple combinations.

Based on a total used amount of the acrylate resin (A-1) and the novolac resin (A-2) being 100 parts by weight, a used amount of the other alkali-soluble resin (A-3) is 0 to 20 parts by weight, preferably 0 to 15 parts by weight, and more preferably 0 to 10 parts by weight.

Photoacid Generator (B)

The photoacid generator (B) is a compound that generates acid after irradiation with light. In the invention, the photoacid generator (B) serves as an catalyst for the polymerization reaction of the alkali-soluble resin (A) with the following cross-linking agent (D). Specifically, the photoacid generator (B) is, for example, an onium salt compound, a halogen-containing compound, a sulfone compound, a sulfonic acid compound, a sulfonimide compound, or a combination thereof.

The onium salt compound is, for example, iodonium salt, sulfonium salt, phosphonium salt, diazonium salt, pyridinium salt or the like. Specific examples of the onium salt compound include diphenyliodonium trifluoromethanesulfonate, diphenyliodonium p-toluenesulfonate, diphenyliodonium hexafluoroantimonate, diphenyliodonium hexafluorophosphate, diphenyliodonium tetrafluoroborate, triphenylsulfonium trifluoromethanesulfonate, triphenylsulfonium p-toluenesulfonate, triphenylsulfonium hexafluoroantimonate, 4-t-butylphenyldiphenylsulfonium trifluoromethanesulfonate, 4-t-butylphenyldiphenylsulfonium p-toluenesulfonate, 4,7-di-n-butoxynaphthyltetrahydrothiophenium trifluoromethanesulfonate, or a combination thereof.

In addition, the onium salt compound may also be cyclohexylmethyl(2-oxocyclohexyl)sulfonium trifluoromethanesulfonate, dicyclohexyl(2-oxocyclohexyl)sulfonium trifluoromethanesulfonate, (2-oxocyclohexyl)(2-norbornyl)sulfonium trifluoromethanesulfonate, 2-cyclohexylsulfonyl cyclohexanone, dimethyl(2-oxocyclohexyl)sulfonium trifluoromethanesulfonate, N-hydroxy succinimide trifluoromethanesulfonate, phenyl p-toluenesulfonate, or a combination thereof.

The halogen-containing compound is, for example, a haloalkyl-containing hydrocarbon compound or a haloalkyl-containing heterocyclic compound. Specific examples of the halogen-containing compound include 1,10-dibromo-n-decane, 1,1-bis(4-chlorophenyl)-2,2,2-trichloroethane, phenylbis(trichloromethyl)-s-triazine, 4-methoxyphenyl bis(trichloromethyl)-s-triazine, styryl bis(trichloromethyl)-s-triazine, naphthyl bis(trichloromethyl)-s-triazine, 2,4-bis(trichloromethyl)-6-p-methoxystyryl-s-triazine (TAZ-110) or similar s-triazine compounds, or a combination thereof.

In addition, the halogen-containing compound may also be a halogen-based flame retardant such as tris(2,3-dibromopropyl)phosphate, tris(2,3-dibromo-3-chloropropyl)phosphate, tetrabromochlorobutane, 2-[2-(3,4-dimethoxyphenyl) ethenyl]-4,6-bis(trichloromethyl)-s-triazine, 2-[2-(4-methoxypheny) ethenyl]-4,6-bis(trichloromethyl)-s-triazine, hexachlorobenzene, hexabromobenzene, hexabromocyclododecane, hexabromocyclododecene, hexabromobiphenyl, allyltribromophenyl ether, tetrachlorobisphenol A, tetrabromobisphenol A, bis(chloroethyl)ether of tetrachlorobisphenol A, bis(bromoethyl)ether of tetrabromobisphenol A, bis(2,3-dichloropropyl)ether of bisphenol A, bis(2,3-dibromopropyl)ether of bisphenol A, bis(2,3-dichloropropyl)ether of tetrachlorobisphenol A, bis(2,3-dibromopropyl)ether of tetrabromobisphenol A, bis(chloroethyl) ether of tetrachlorobisphenol S, tetrabromobisphenol S, tetrachlorobisphenol S, bis(bromoethyl)ether of tetrabromobisphenol S. bis(2,3-dichloropropyl)ether of bisphenol S, bis(2,3-dichloropropyl)ether of bisphenol S, tris(2,3-dibromopropyl)isocyanurate, 2,2-bis(4-hydroxy-3,5-dibromophenyl)propane, 2,2-bis(4-(2-hydroxyethoxy)-3,5-dibromophenyl)propane or the like.

The sulfone compound is, for example, a β-ketosulfone compound, a β-sulfonyl sulfone compound, or an α-diazo compound of a combination thereof. Specific examples of the sulfone compound include 4-trisphenacyl sulfone, 2,4,6-mesityl phenacyl sulfone, bis(phenacylsulfonyl)methane, or a combination thereof.

The sulfonic acid compound is, for example, alkylsulfonic acid ester, haloalkylsulfonic acid ester, arylsulfonic acid ester or iminosulfonate. Specific examples of the sulfonic acid compound include benzoin tosylate, pyrogallol tris(trifluoromethanesulfonate), o-nitrobenzyl trifluoromethanesulfonate, o-nitrobenzyl p-toluenesulfonate, or a combination thereof.

Specific examples of the sulfonimide compound include N-(trifluoromethylsulfonyloxy)succinimide, N-(trifluoromethylsulfonyloxy)phthalimide, N-(trifluoromethyl sulfonyloxy)diphenylmaleimide, N-(trifluoromethylsulfonyloxy)bicyclo[2.2.1]hept-5-ene-2,3-dicarboxyimide, N-(trifluoromethyl sulfonyloxy)naphthylimide (NAI-105), or a combination thereof.

Preferred examples of the photoacid generator (B) are 2,4-bis(trichloromethyl)-6-p-methoxystyryl-s-triazine (TAZ-110), N-(trifluoromethyl sulfonyloxy)naphthylimide (NAI-105), triphenylsulfonium trifluoromethanesulfonate, or a combination thereof.

The photoacid generator (B) may be used alone or in multiple combinations.

Based on a used amount of the alkali-soluble resin (A) used being 100 parts by weight, a used amount of the photoacid generator (B) is generally 0.5 to 6 parts by weight, preferably 0.7 to 5.5 parts by weight, and more preferably 1 to 5.0 parts by weight.

Basic Compound (C)

The basic compound (C) is, for example, an aliphatic primary amine, an aliphatic secondary amine, an aliphatic tertiary amine, an amino alcohol, an aromatic amine, a quaternary ammonium hydroxide, an alicyclic amine, or a combination thereof. Specific examples of the basic compound (C) include butylamine, hexylamine, ethanolamine, triethanolamine, 2-ethylhexylamine, 2-ethylhexyloxypropylamine, methoxypropylamine, diethylaminopropylamine, N-methylaniline, N-ethylaniline, N-propylaniline, dimethyl-N-methylaniline, diethyl-N-methylaniline, diisopropyl-N-dimethylaniline, N-methylamino phenol, N-ethylamino phenol, N,N-dimethylaniline, N,N-diethylaniline, N,N-dimethylamino phenol, tripentylamine, tetrabutylammonium hydroxide, tetramethylammonium hydroxide, 1,8-diazabicyclo[5.4.0]-7-undecene, 1,5-diazabicyclo[4.3.0]-5-nonene, or a combination thereof.

Preferred examples of the basic compound (C) are tripentylamine, N-ethylaniline, N,N-dimethylamino phenol, tetramethylammonium hydroxide (TMAH), diethylaminopropylamine, or a combination thereof.

The basic compound (C) may be used alone or in multiple combinations.

In the event that the basic compound (C) is not employed in the negative photosensitive resin composition, the photoresist pattern formed by the resulting negative photosensitive resin composition has poor stripping property.

Based on a used amount of the alkali-soluble resin (A) used being 100 parts by weight, a used amount of the basic compound (C) is generally 0.3 to 3 parts by weight, preferably 0.4 to 2.8 parts by weight, and more preferably 0.5 to 2.5 parts by weight.

It is worth noting that since the basic compound (C) increases the solubility of the photoresist pattern formed by the negative photosensitive resin composition in a stripping liquid, the stripping property of the photoresist pattern with a substrate is effectively enhanced.

Cross-Linking Agent (D)

The cross-linking agent (D) is a compound that promotes formation of a covalent bond or ionic bond between linear molecules, and as a result, the linear molecules are linked with each other, thus forming a polymer network. It should be noted that due to catalysis of the photoacid generator (B), the alkali-soluble resin (A) reacts with the cross-linking agent (D) to form a polymer having a higher degree of cross-linking.

The cross-linking agent (D) is, for example, alkoxy methylated urea resin, alkoxy methylated melamine resin, alkoxy methylated uronresin, alkoxy methylated glycoluryl resin, or alkoxy methylated amino resin.

In addition, the cross-linking agent (D) may also be alkyl etherified melamine resin, benzoguanamine resin, alkyl etherified benzoguanamine resin, urea resin, alkyl etherified urea resin, urethane formaldehyde resin, resol-type phenol-formaldehyde resin, alkyl etherified resol-type phenol-formaldehyde resin, epoxy resin, alkoxy methylated amino resin, or a combination thereof.

Specific examples of the alkoxy methylated amino resin include methoxy methylated amino resin, ethoxy methylated amino resin, n-propoxy methylated amino resin, n-butoxy methylated amino resin, or a combination thereof. Specific examples of commercial products of the alkoxy methylated amino resin include PL-1170, PL-1174, UFR 65, CYMEL 300, CYMEL 303 (above are manufactured by Mitsui Cytec, Ltd.), BX-4000, NIKALAC MW-30, MX-290, MW-30HM, MS-11, MS-001, MX-750 or MX-706 (above are manufactured by Sanwa Chemical Industrial Co., Ltd.), or a combination thereof.

Preferred examples of the cross-linking agent (D) are CYMEL 303, NIKALAC MW-30, PL-1170, or a combination thereof.

The cross-linking agent (D) may be used alone or in multiple combinations.

Based on a used amount of the alkali-soluble resin (A) being 100 parts by weight, a used amount of the cross-linking agent (D) is generally 5 to 35 parts by weight, preferably 6 to 32 parts by weight, and more preferably 7 to 30 parts by weight.

Solvent (E)

The solvent (E) employed for the negative photosensitive resin composition refers to an organic solvent capable of dissolving the aforementioned components without reacting with the same.

The solvent (E) is, for example, (poly)alkylene glycol monoalkyl ethers, (poly)alkylene glycol monoalkyl ether acetates, other ethers, ketones, alkyl lactates, other esters, aromatic hydrocarbons, amides, or a combination thereof.

Specific examples of the (poly)alkylene glycol monoalkyl ethers include ethylene glycol monomethyl ether, ethylene glycol monoethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether (PGEE), dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether or the like, or a combination thereof.

Specific examples of the (poly)alkylene glycol monoalkyl ether acetates include ethylene glycol monomethyl ether acetate, ethylene glycol monoethyl ether acetate, propylene glycol monomethyl ether acetate (PGMEA), propylene glycol monoethyl ether acetate or the like, or a combination thereof.

Specific examples of the ethers include diethylene glycol dimethyl ether, diethylene glycol methyl ethyl ether, diethylene glycol diethyl ether, tetrahydrofuran or the like, or a combination thereof.

Specific examples of the ketones include methyl ethyl ketone, cyclohexanone, 2-heptone, 3-heptone or the like, or a combination thereof.

Specific examples of the alkyl lactates include methyl 2-hydroxy propionate, ethyl 2-hydroxy propionate (also known as ethyl lactate (EL)) or the like, or a combination thereof.

Specific examples of other esters include methyl 2-hydroxy-2-methyl propionate, ethyl 2-hydroxy-2-methyl propionate, methyl 3-methoxypropionate, ethyl 3-methoxypropionate, methyl 3-ethoxypropionate, ethyl 3-ethoxypropionate, ethyl ethoxyacetate, ethyl hydroxy acetate, methyl 2-hydroxy-3-methyl butanoate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl acetate, i-pentyl acetate, n-butyl propionate, ethyl butanoate, n-propyl butanoate, i-propyl butanoate, n-butyl butanoate, methyl pyruvate, ethyl pyruvate, n-propyl pyruvate, methyl acetoacetate, ethyl acetoacetate, ethyl 2-oxobutanoate or the like, or a combination thereof.

Specific examples of the aromatic hydrocarbons include toluene, xylene or the like, or a combination thereof.

Specific examples of the amides include N-methyl pyrrolidone, N,N-dimethyl formamide, N,N-dimethyl acetamide or the like, or a combination thereof. Preferred examples of the solvent (E) are propylene glycol monomethyl ether acetate, ethyl lactate, cyclohexanone, propylene glycol monoethyl ether, or a combination thereof. The solvent (E) may be used alone or in multiple combinations.

Based on a used amount of the alkali-soluble resin (A) being 100 parts by weight, a used amount of the solvent (E) is generally 100 to 1000 parts by weight, preferably 120 to 800 parts by weight, and more preferably 150 to 600 parts by weight.

Additive (F)

An additive (F) is optionally added to the negative photosensitive resin composition utilized in the invention. Specifically, the additive (F) is, for example, an adhesion auxiliary agent, a leveling agent, a diluent, a sensitizer or the like.

The adhesion auxiliary agent is, for example, a silane-based compound so as to enhance the adhesion property between the negative photosensitive resin composition and the substrate. Specific examples of the silane-based compound include vinyltrimethoxysilane, vinyltriethoxysilane, 3-(methyl)acryloyloxypropyltrimethoxysilane (MPTMS), vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropyldimethylmethoxysilane, 2-(3,4-epoxycyclohexyl)ethyltrimethoxysilane, 3-chloropropylmethyldimethoxysilane, 3-chloropropyltrimethoxysilane, 3-mercaptopropyltrimethoxysilane, 1,2-bis-(trimethoxysilyl)ethane, or a combination thereof.

In an embodiment of the invention, based on a used amount of the alkali-soluble resin (A) being 100 parts by weight, a used amount of the adhesion auxiliary agent is generally 0 to 2 parts by weight, preferably 0.001 to 1 part by weight, and more preferably 0.005 to 0.8 part by weight.

The leveling agent includes fluoro-based surfactants or silicon-based surfactants. Specific examples of the fluoro-based surfactants include commercial products such as Flourate FC-430, FC-431 (manufactured by 3M Company), F top EF122A, 122B, 122C, 126, BL20 (manufactured by Tochem Products Co., Ltd.), or a combination thereof. Specific examples of the silicon-based surfactants include commercial products such as SF-8427 and SH29PA (manufactured by Dow Corning Toray Silicone Co., Ltd.), or a combination thereof.

Based on a used amount of the alkali-soluble resin (A) being 100 parts by weight, a used amount of the leveling agent is generally 0 to 1.2 parts by weight, preferably 0.025 to 1.0 parts by weight, and more preferably 0.050 to 0.8 part by weight.

Specific examples of the diluent include commercial products such as RE801 and RE802 (manufactured by TEIKOKU INK) or the like, or a combination thereof.

Specific examples of the sensitizer include commercial products such as TPPA-1000P, TPPA-100-2C, TPPA-1100-3C, TPPA-1100-4C, TPPA-1200-24X, TPPA-1200-26X, TPPA-1300-235T, TPPA-1600-3M6C and TPPA-MF (manufactured by Honshu Chemical Industry Co., Ltd.), or a combination thereof. A preferred example of the sensitizer is TPPA-600-3M6C or TPPA-MF. The sensitizer may be used alone or in multiple combinations.

Based on a used amount of the alkali-soluble resin (A) being 100 parts by weight, a used amount of the sensitizer is generally 0 to 20 parts by weight, preferably 0.5 to 18 parts by weight, and more preferably 1.0 to 15 parts by weight.

The additive (F) may be used alone or in multiple combinations. In addition, other additives such as a plasticizer, a stabilizer or the like may also be added to the invention as needed.

The alkali-soluble resin (A), the photoacid generator (B), the basic compound (C), the cross-linking agent (D), and the solvent (E) are placed in a mixer and stirred, so that the resultant is uniformly mixed to be in a solution state, thus obtaining the negative photosensitive resin composition. The additive (F) may be added thereto if necessary.

The negative photosensitive resin composition is used for forming a photoresist pattern. The photoresist pattern serves as a pattern for forming a metallic pattern, and the metallic pattern further serves as a metal electrode in a light emitting diode grain. In addition, in an organic light emitting diode display device, the photoresist pattern also serves as a rib on a substrate. The details are described as follows:

Method for Forming Photoresist Pattern

The negative photosensitive resin composition is used for forming a photoresist pattern. The details of the method for forming a photoresist pattern are described hereinafter. The method includes the following steps: forming a photoresist film by using the negative photosensitive resin composition, performing a photoresist patterned exposure to the photoresist film, and removing an unexposed region via an alkali development to form the photoresist pattern.

—Forming Coating Film—

The negative photosensitive resin composition in the solution state is uniformly coated on a substrate by coating methods such as spin coating, cast coating or roll coating, so as to form a coating film. The substrate is, for example, a silicon substrate, a glass substrate, an indium tin oxide (ITO) film substrate, a chromium film formed substrate or a resin substrate.

After the coating film is formed, a majority portion of organic solvent of photocurable polysiloxane compositions is removed through drying under reduced pressure, and then the remaining organic solvent is completely removed by pre-baking, so as to form a photoresist film. In general, the pre-baking is to perform a heat treatment to the photoresist film at a temperature of 80° C. to 110° C. for 10 to 200 seconds. As a result, the photoresist film having a thickness of 0.5 to 5 microns is obtained.

—Photoresist Patterned Exposure—

The photoresist film is exposed using a mask having a specific pattern. In the present embodiment, the negative photosensitive resin composition is a cross-linking amplified resist material, and uses the photoacid generator (B) and the cross-linking agent (D) as cross-linking components. Therefore, after the photoresist film is pattern exposed, a heat treatment is performed to the photoresist film at a temperature of 100° C. to 130° C. for 10 to 200 seconds, so as to increase a degree of cross-linking reaction.

A light used in the process of exposure is, for example, ultraviolet, far ultraviolet, KrF excimer laser beam or X ray. Specifically, specific examples of the light used for the exposure include line spectrums of 436 nm, 405 nm, 365 nm or 254 nm mercury and KrF excimer laser beam of 248 nm.

—Development—

The exposed photoresist film is immersed in an alkali developing solution to remove the unexposed part of the photoresist film, so that the photoresist pattern is formed on the substrate.

An alkaline aqueous solution is generally used as a developer. An alkaline developing solution is, for example, an inorganic base such as sodium hydroxide, potassium hydroxide, sodium silicate, ammonia or the like; primary amine such as ethylamine, propylamine or the like; secondary amine such as diethylamine, propylamine or the like; tertiary amine such as trimethylamine, triethylamine or the like; amino alcohol such as diethylethanolamine, triethanolamine or the like; or quaternary ammonium hydroxide such as tetramethylammonium hydroxide, tetraethylammoniumhydroxide, triethylhydroxymethyl ammonium hydroxide, trimethylhydroxyethylammonium hydroxide or the like. A water-soluble organic solvent such as methyl alcohol, ethyl alcohol, propyl alcohol, ethylene glycol or the like, a surfactant, or a dissolution inhibitor with respect to resin may also be added to the alkaline aqueous solution as needed.

Method for Fabricating Light Emitting Diode Grain

In the present embodiment, the photoresist pattern formed by the negative photosensitive resin composition serves as a pattern for forming a metal electrode in a light emitting diode grain. The details of the method for forming a light emitting diode grain is as illustrated in FIGS. 1A to 1C.

Please refer to FIG. 1A. First, a semiconductor layer 120 is formed on a substrate 110. In the present embodiment, the semiconductor layer 120 includes an N-type semiconductor layer 120a, an active layer 120b and a P-type semiconductor layer 120c. The N-type semiconductor layer 120a, the active layer 120b and the P-type semiconductor layer 120c are arranged in sequence on the substrate 110. Next, a photoresist pattern 130 is formed on the semiconductor layer 120 using the aforementioned method for forming a photoresist pattern. In the present embodiment, the photoresist pattern 130 is in a shape having a wide top and a narrow bottom (i.e. reversed tapered shape).

Figure 1B:
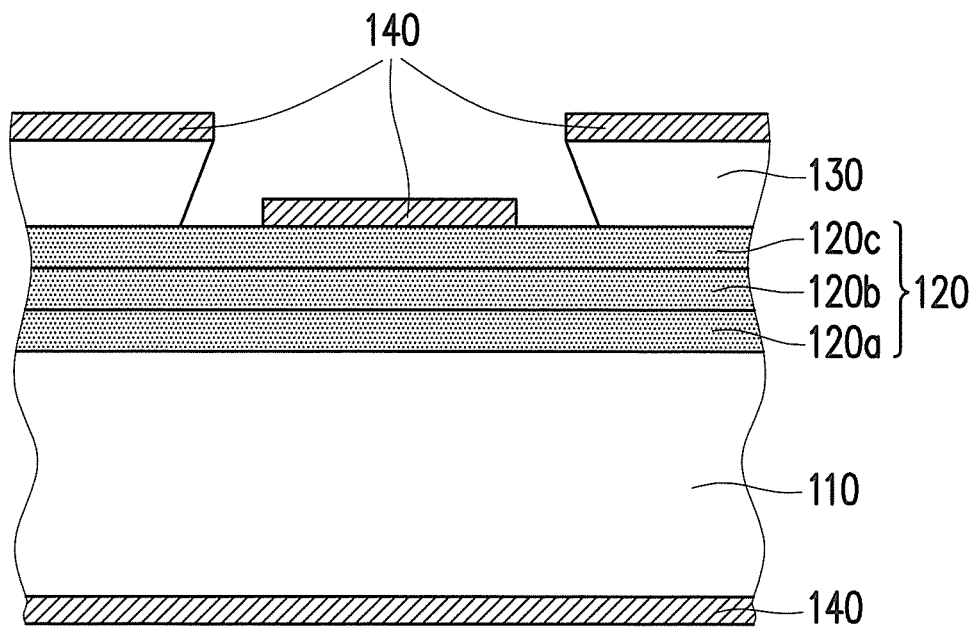

Then, referring to FIG. 1B, a metal layer 140 is formed on two sides of the semiconductor layer 120 by a sputtering method, a deposition method or other suitable methods, so that the metal layer 140 covers the substrate 110, the semiconductor layer 120 and the photoresist pattern 130. In addition, the metal layer 140 may be made of gold, silver, aluminium, copper or other suitable metal material.

Figure 1C:
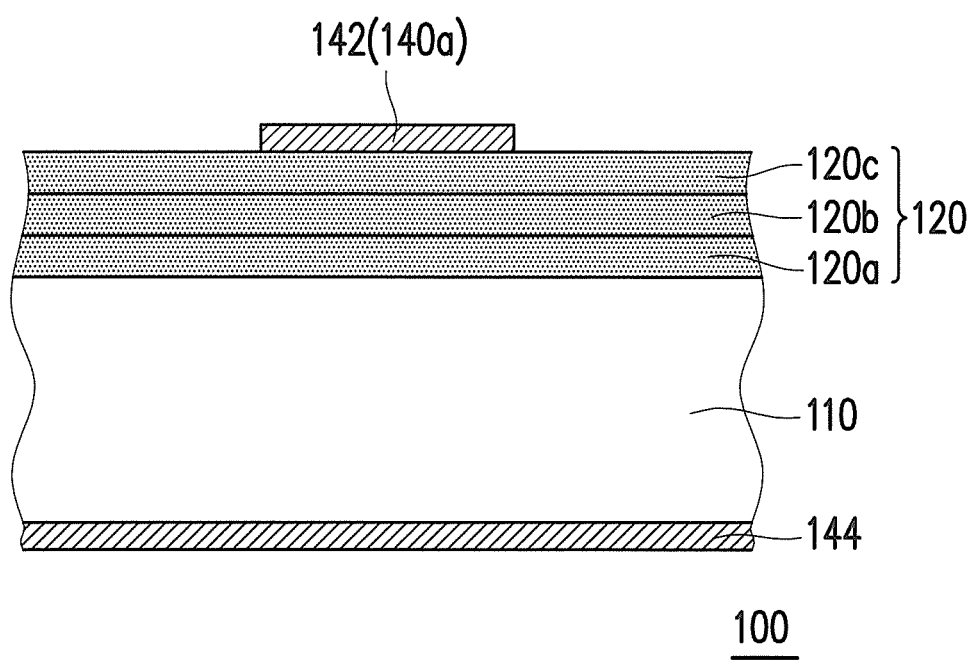

Then, please refer to FIG. 1C. The photoresist pattern 130 and the metal layer 140 on the photoresist pattern 130 are removed by a lift-off method, so as to patterning to the metal layer 140, such that a metallic pattern 140a is formed on the semiconductor layer 120. It should be noted that, in the present embodiment, since the photoresist pattern 130 is in the shape having a wide top and a narrow bottom (i.e. reversed tapered shape), the metal layer 140 covering on the semiconductor layer 120 and the metal layer 140 covering on the photoresist pattern 130 are not continuous, and thus may be easily removed. In other embodiments, the photoresist pattern 130 may be designed to be in a shape having a narrow top and a wide bottom (i.e. forward tapered shape) or a shape of equal width at top and bottom (i.e. vertical shape).

It is worth noting that the metallic pattern 140a on the semiconductor layer 120 may serve as a first electrode layer 142, and the metal layer 140 on the substrate 110 may serve as a second electrode layer 144. In this way, a light emitting diode grain 100 as shown in FIG. 1C is formed. In addition, although in the present embodiment, the second electrode layer 144 is not patterned and completely covers the substrate 110, the second electrode layer 144 may also be patterned depending on product requirements.

Method for Fabricating Organic Light Emitting Diode Display Device

In the present embodiment, the photoresist pattern formed by the negative photosensitive resin composition serves as a rib, thereby forming an organic light emitting diode display device. The details of the method for fabricating the organic light emitting diode display device is as illustrated in FIGS. 2A to 2C.

Figure 2A:
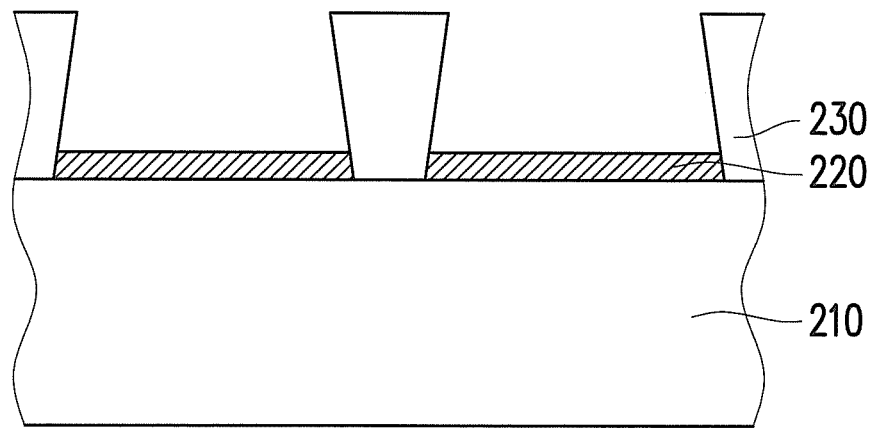
FIGS. 2A to 2C are schematic diagrams of a method for fabricating an organic light emitting diode display device according to an embodiment of the invention.

Please refer to FIG. 2A. First, a first semiconductor layer 220 is formed on a substrate 210. According to an embodiment, the first semiconductor layer 220 is a plurality of electrode patterns. A material of the first semiconductor layer 220 includes a metal oxide, for example, an indium tin oxide or the like. According to another embodiment, the first semiconductor layer 220 includes a plurality of electrode patterns and an active element connected with the electrode patterns. A material of the electrode patterns includes a metal oxide, for example, an indium tin oxide or the like. The active device includes at least one thin film transistor.

Then, a rib 230 is formed on the substrate 210. In the present embodiment, a method for forming the rib 230 is, for example, the aforementioned method for forming a photoresist pattern. Here, the rib 230 is located on a periphery of the first electrode layer 220. In addition, in the present embodiment, the rib 230 is in a reversed tapered shape. In other embodiments, the rib 230 may be designed to be in a forward tapered shape or a vertical shape as needed.

Figure 2B:
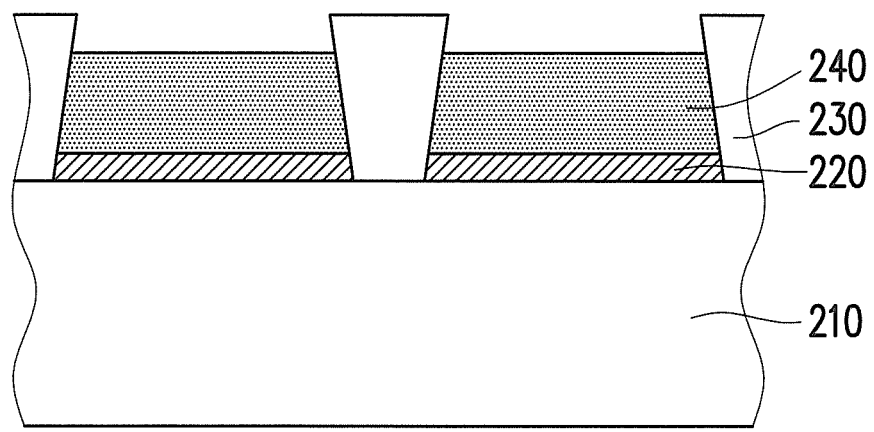
Figure 2C:
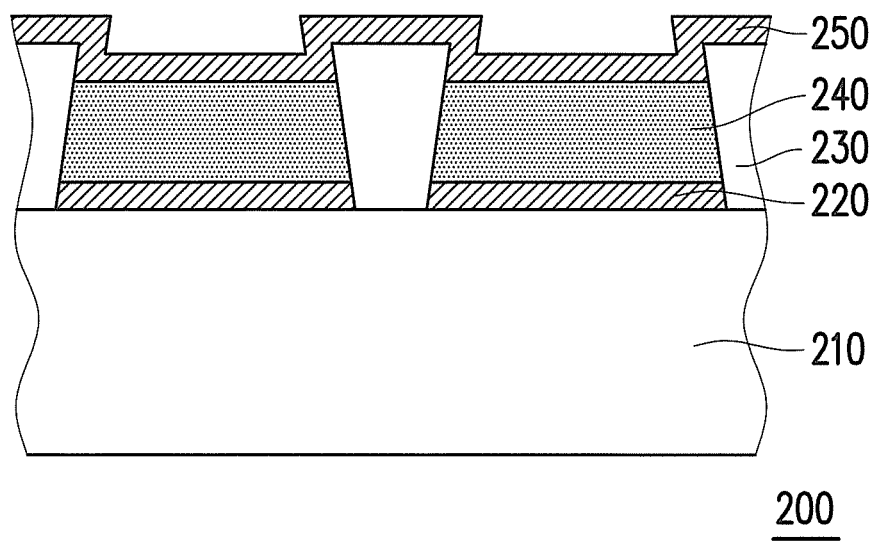

After that, referring to FIG. 2B, an organic material is applied within a region defined by the rib 230 using an ink-jet method, so as to form an organic layer 240. It should be noted that the organic layer 240 may have a single layer structure or a multi-layer structure. Specifically, the organic layer 240 includes a light-emitting layer, a hole transporting material, a hole injecting material, an electron transporting material, an electron injecting material, or a combination thereof.

Finally, referring to FIG. 2C, a metal layer is evaporated on surfaces of the rib 230 and the organic layer 240 by sputtering, evaporation or other suitable methods, so as to form a second electrode layer 250. In this way, an organic light emitting diode display device 200 as shown in FIG. 2C is formed.

Synthesis Example A-1

Synthesis Examples A-1-1 to A-1-12 of an acrylate resin are described as follows:

Synthesis Example A-1-1

A 500 ml four-necked flask was provided with a nitrogen inlet, a stirrer, a heater, a condenser tube and a thermometer, and nitrogen was introduced into the four-necked flask. Next, according to the reagents and amounts used specified in Table 2 (also see Table 1 for names and abbreviations of the reagents), 50 parts by weight of diethylene glycol dimethyl ether (DIGLYME) and 250 parts by weight of propylene glycol monomethyl ether acetate (PGMEA) were added as a solvent. Then, the solvent was stirred while heated to 85° C. Next, 40 parts by weight of methacrylic acid (MAA) and 60 parts by weight of dicyclopentanyl methacrylate (FA-513M) were added into the four-necked flask. The resulting solution was stirred with its temperature maintained at 85° C. Next, 2.0 parts by weight of 2,2'-azobis(2-methylbutyronitrile) (AMBN) were dissolved in 120 parts by weight of diethylene glycol dimethyl ether as a solvent in advance, and then were divided into five equal parts, one of which was added into the four-necked flask every hour. Then, a polymerization was performed at 85° C. for 5 hours. Finally, the solvent was evaporated to obtain the acrylate resin in Synthesis Example A-1-1.

Synthesis Examples A-1-2 to A-1-12

Synthesis methods same as that in Synthesis Example A-1-1 were used except that in Synthesis Examples A-1-2 to A-1-12, reactants and amounts used, reaction temperatures and polymerization times were changed. Table 1 shows the reactants and amounts used, reaction temperatures and polymerization times in Synthesis Examples A-1-2 to A-1-12.

TABLE 1

| Compound | Name |
|---|---|
| MAA | methacrylic acid |
| HOMS | 2-methacryloyl oxyethyl succinate |
| MA | maleic anhydride |
| FA-513M | dicyclopentanyl methacrylate |
| DCPA | dicyclopentenyl acrylate |
| DPOEMA | dicyclopentanyloxyethyl methacrylate |
| IBOMA | isobornyl methacrylate |
| DEBHA | 1-ethyl-7,7-dimethyl bicyclo[2.2.1]heptane-2-yl (meth)acrylate |
| DPBHMA | 7,7-dimethyl-1-propyl bicyclo[2.2.1]heptane-2-yl (meth)acrylate |
| HEMA | 2-hydroxy ethyl methacrylate |
| 3-HPMA | 3-hydroxy propyl methacrylate3-hydroxy ethyl methacrylate |
| N-MA | N-methylol acrylamide |
| BzMA | benzyl methacrylate |
| BD | 1-3-butadiene |
| SM | styrene monomer |
| DIGLYME | diethylene glycol dimethyl ether |
| PGMEA | propylene glycol monomethyl ether acetate |
| AMBN | 2,2'-azobis(2-methylbutyronitrile) |
| ADVN | 2,2'-azobis(2,4-dimethylvaleronitrile) |

TABLE 2

| Synthesis Example | | A-1-1 | A-1-2 | A-1-3 | A-1-4 | A-1-5 | A-1-6 | A-1-7 | A-1-8 | A-1-9 | A-1-10 | A-1-11 | A-1-12 |
|---|---|---|---|---|---|---|---|---|---|---|---|---|---|
| Unsaturated carboxylic acid or unsaturated carboxylic acid anhydride monomer (a-1-1) (part by weight) | MAA | 40 | 40 | — | — | 30 | — | 30 | — | — | 10 | — | 30 |
| | HOMS | — | — | 30 | — | 10 | — | — | 20 | — | — | — | — |
| | MA | — | — | — | 30 | — | 30 | — | 10 | 20 | — | 5 | — |
| Compound (a-1-2-1) with tricyclodecane or dicyclopentadiene structure (part by weight) | FA-513M | 60 | — | — | — | — | — | 30 | — | — | 20 | — | — |
| | DCPA | — | 20 | — | — | — | — | — | — | 10 | — | — | — |
| | DPOEMA | — | 10 | 15 | — | — | — | — | 20 | — | — | — | — |
| Compound (a-1-2-2) represented by formula (1) (part by weight) | IBOMA | — | — | — | 60 | — | — | 20 | — | — | — | 10 | — |
| | DEBHA | — | — | — | — | 20 | — | — | — | 10 | — | — | — |
| | DPBHMA | — | — | — | — | 10 | 15 | — | 10 | — | — | — | — |
| Monomer (a-1-3) having hydroxy | HEMA | — | — | — | — | — | — | — | 10 | — | 20 | — | 20 |
| | 3-HPMA | — | — | — | — | — | — | — | — | 20 | — | — | — |

TABLE 2-continued

| Synthesis Example | | A-1-1 | A-1-2 | A-1-3 | A-1-4 | A-1-5 | A-1-6 | A-1-7 | A-1-8 | A-1-9 | A-1-10 | A-1-11 | A-1-12 |
|---|---|---|---|---|---|---|---|---|---|---|---|---|---|
| group (part by weight) | N-MA | — | — | — | — | — | — | — | — | — | — | 30 | — |
| Other monomer (a-1-4) (part by weight) | BzMA | — | 30 | 35 | 10 | — | 20 | — | — | 40 | — | 20 | 30 |
| | BD | — | — | — | — | — | — | 10 | — | — | 5 | — | — |
| | SM | — | — | 20 | — | 30 | 35 | 10 | 30 | — | 45 | 35 | 20 |
| Solvent (part by weight) | DIGLYME | 50 | — | — | 50 | — | — | 200 | — | — | 50 | 150 | — |
| | PGMEA | 250 | 250 | 250 | 250 | 250 | 250 | — | 200 | 200 | 250 | 50 | 150 |
| Polymerization initiator (part by weight) | AMBN | 2.0 | 2.0 | — | — | — | — | 1.5 | — | 1.5 | 1.5 | — | 0.5 |
| | ADVN | — | — | 2.0 | 2.0 | 2.0 | 2.0 | 0.5 | 1.5 | — | 0.5 | 1.5 | 1.0 |
| Reaction temperature (° C.) | | 85 | 80 | 70 | 80 | 85 | 70 | 80 | 70 | 70 | 80 | 70 | 70 |
| Polymerization time (hr) | | 5 | 5 | 6 | 5 | 5 | 6 | 5 | 6 | 6 | 5 | 6 | 6 |

Synthesis Example A-2

Synthesis Examples A-2-1 to A-2-5 of the novolac resin (A-2) are described as follows.

Synthesis Example A-2-1

A 1000 ml four-necked flask was provided with a nitrogen inlet, a stirrer, a heater, a condenser tube and a thermometer, and nitrogen was introduced into the four-necked flask. Next, according to the reagents and amounts used specified in Table 3, 0.07 mol of o-cresol, 0.3 mol of m-cresol, 0.6 mol of p-cresol, 0.03 mol of 3,5-xylenol, 0.65 mol of formaldehyde and 0.02 mol of oxalic acid were added into the four-necked flask. The solvent was stirred while heated to 100° C., followed by polymerization at 100° C. for 6 hours. Then, the resulting reaction solution was heated to 180° C. and further dried under reduced pressure of 10 mmHg, so that the solvent was evaporated. Finally, the novolac resin in Synthesis Example A-2-1 was obtained. Table 3 shows the reactants and amounts used for preparing the novolac resin in Synthesis Example A-2-1.

Synthesis Examples A-2-2 to A-2-5

Synthesis methods same as that in Synthesis Example A-2-1 were used except that in Synthesis Examples A-2-2 to A-2-5, the reactants and amounts used, the reaction temperatures and polymerization times were changed. Table 3 shows the reactants and amounts used, reaction temperatures and polymerization times in Synthesis Examples A-2-2 to A-2-5.

EMBODIMENTS

Embodiment 1

10 parts by weight of the acrylate resin in Synthesis Example A-1-1, 90 parts by weight of the novolac resin in Synthesis Example A-2-1, 0.5 part by weight of 2,4-bis (trichloromethyl)-6-p-methoxystyryl-s-triazine (compound B-1), 0.3 part by weight of tripentylamine (compound C-1), and 5 parts by weight of CYMEL 303 (compound D-1) were added in 100 parts by weight of propylene glycol monomethyl ether acetate. The resultant was uniformly stirred by a shaking type stirrer to obtain the negative photosensitive resin composition in Embodiment 1.

The negative photosensitive resin composition in Embodiment 1 was coated on a glass substrate by spin coating, so as to form a coating film. Next, the coating film was pre-baked at 100° C. for 90 seconds, so as to form a photoresist film having a thickness of approximately 3.4 µm. The photoresist film was pattern exposed to ultraviolet light of 80 mJ/cm$^2$ (using an exposing apparatus with a trade name AG500-4N manufactured by M&R Nanotechnology and a line-and-space mask manufactured by NIPPON FILCON CO., LTD.). Next, the photoresist film was baked for at 110° C. for 2 minutes to increase the degree of cross-linking reaction. After that, the substrate having the exposed photoresist film thereon was developed with a 2.38% tetramethylammonium hydroxide (TMAH) aqueous solution having a temperature of 23° C. for 1 minute, thereby removing the unexposed part of the photoresist film on the substrate. Accordingly, 100 cylinders (i.e. semi-finished products of photoresist patterns) having a diameter of 20 µm were obtained. Then, the glass substrate was washed with water. Finally, the semi-finished products of photoresist patterns were post-baked at 120° C. in an oven for 2 minutes, so as to obtain the photoresist pattern in Embodiment 1.

TABLE 3

| Synthesis Example | | | A-2-1 | A-2-2 | A-2-3 | A-2-4 | A-2-5 |
|---|---|---|---|---|---|---|---|
| Aromatic hydroxy compound (mol) | Cresol (a-2-1) | o-Cresol | 0.07 | — | — | — | 0.2 |
| | | m-Cresol | 0.3 | 0.6 | 0.5 | 0.5 | 0.4 |
| | | p-Cresol | 0.6 | 0.3 | 0.2 | — | 0.4 |
| | Xylenol (a-2-2) | 3,5-Xylenol | 0.03 | — | — | 0.2 | — |
| | | 3,4-Xylenol | — | 0.1 | — | 0.3 | — |
| | | 2,5-Xylenol | — | — | 0.3 | — | — |
| Aldehydes (mol) | | Formaldehyde | 0.65 | 0.65 | — | 0.7 | 0.7 |
| | | Benzaldehyde | — | 0.05 | 0.65 | — | — |
| Catalyst (mol) | | Oxalic acid | 0.02 | 0.02 | 0.02 | 0.02 | 0.02 |
| Reaction temperature (° C.) | | | 100 | 100 | 105 | 105 | 100 |
| Polymerization time (hr) | | | 6 | 6 | 6 | 5.5 | 6 |

In addition, with respect to the photoresist pattern formed by the negative photosensitive resin composition in Embodiment 1, an evaluation of the stripping property and tolerance to evaporation process was conducted. The result is shown in Table 5.

Embodiments 2 to 11

The negative photosensitive resin compositions and the photoresist patterns in Embodiments 2 to 11 were prepared using the same steps as described in Embodiment 1, except that the components and amounts used were changed (as shown in Table 5). The names of the compounds to which reference numbers listed in Table 5 correspond are shown in Table 4. In addition, with respect to the photoresist patterns formed by the negative photosensitive resin compositions, evaluations of the stripping property and degree of tolerance to evaporation process were conducted. The results are shown in Table 5.

TABLE 4

| | |
|---|---|
| A-3-1 | V259ME (manufactured by Nippon Steel Chemical) |
| A-3-2 | UN-904 (manufactured by Negami Chemical Industrial Co., Ltd.) |
| B-1 | 2,4-bis(trichloromethyl)-6-p-methoxystyryl-s-triazine (TAZ-110) |
| B-2 | N-(trifluoromethyl sulfonyloxy) naphthylimide (NAI-105) |
| B-3 | triphenylsulfonium trifluoromethanesulfonate |
| C-1 | tripentylamine |
| C-2 | N-ethylaniline |
| C-3 | N,N-dimethylamino phenol |
| C-4 | tetramethylammonium hydroxide (TMAH) |
| C-5 | diethylaminopropylamine |
| D-1 | CYMEL 303 (manufactured by Mitsui Cytec, Ltd.; alkoxy methylated amino resin) |
| D-2 | NIKALAC MW-30 (manufactured by Sanwa Chemical Industrial Co., Ltd.; alkoxy methylated amino resin) |
| D-3 | PL-1170 (manufactured by Sanwa Chemical Industrial Co., Ltd.; alkoxy methylated amino resin) |
| E-1 | propylene glycol monomethyl ether acetate (PGMEA) |
| E-2 | ethyl lactate (EL) |
| E-3 | cyclohexanone |
| F-1 | SF-8427 (manufactured by Dow Corning Toray Silicone Co., Ltd.; surfactant) |
| F-2 | 3-glycidoxypropyltrimethoxysilane (trade name: KBM403; manufactured by Shin-Etsu Chemical Co., Ltd.; adhesion auxiliary agent) |

Comparative Examples 1 to 6

The negative photosensitive resin compositions and the photoresist patterns in Comparative Examples 1 to 6 were prepared using the same steps as described in Embodiment 1, except that the components and amounts used were changed (as shown in Table 6). The names of the compounds to which reference numbers listed in Table 6 correspond are shown in Table 4. In addition, with respect to the photoresist patterns formed by the negative photosensitive resin compositions, evaluations of the stripping property and tolerance to evaporation process were conducted. The results are shown in Table 6.

Evaluation Methods

[Evaluation of Stripping Property]

The photoresist patterns (i.e. cylinders) in Embodiments 1 to 11 and Comparative Examples 1 to 6 were immersed in a stripping liquid (ST-897; manufactured by Chi Mei Corporation) at 70° C. for 3 minutes, so that the photoresist patterns (i.e. cylinders) on the substrate were stripped off. After the above treatment, an observation was conducted on the number of the cylinders remaining on the substrate. A smaller number of the cylinders remaining indicates better stripping property of the photoresist pattern (i.e. the photoresist pattern is easily removable). The stripping property of the photoresist pattern was evaluated in accordance with the following criteria.

⊚: 0≤number of the cylinders remaining<5
○: 5≤number of the cylinders remaining<10
Δ: 10≤number of the cylinders remaining<15
X: 15≤number of the cylinders remaining

[Evaluation of Tolerence to Evaporation Process]

A metal layer having a thickness of 5000 Å was evaporated on the photoresist patterns in Embodiments 1 to 11 and Comparative Examples 1 to 6 using a vacuum evaporator (trade name: EVD-500; manufactured by CANON ANELVA CORPORATION). Next, the number of damaged cylinders on the substrate was observed by using a scanning electron microscope (SEM). A smaller number of the damaged cylinders indicates the photoresist pattern had better tolerance to evaporation process. The tolerance to evaporation process of the photoresist pattern was evaluated in accordance with the following criteria.

⊚: 0≤number of damaged cylinders<5
○: 5≤number of damaged cylinders<10
Δ: 10≤number of damaged cylinders<20
X: 20≤number of damaged cylinders Results of Evaluation Please refer to Table 5 and Table 6. In Comparative Example 1, the novolac resin (A-2) was employed solely in the negative photosensitive resin composition, while the acrylate resin (A-1) was not employed. In Comparative Example 2, the acrylate resin (A-1) was employed solely in the negative photosensitive resin composition, while the novolac resin (A-2) was not employed. In Comparative Example 3, the other alkali-soluble resin (A-3) was employed solely in the negative photosensitive resin composition, while neither the acrylate resin (A-1) nor the novolac resin (A-2) was employed. From the results, it is known that the photoresist patterns in Comparative Examples 1, 2 and 3 all showed poor stripping property and poor tolerance to the evaporation process. By contrast, the negative photosensitive resin compositions used in Embodiments 1 to 11 contained both the acrylate resin (A-1) and the novolac resin (A-2), and the photoresist patterns in Embodiments 1 to 11 showed good stripping property and good tolerance to the evaporation process. Therefore, it is known that photoresist patterns formed by the negative photosensitive resin compositions containing both the acrylate resin (A-1) and the novolac resin (A-2) have good stripping property and good tolerance to the evaporation process.

The negative photosensitive resin composition in Comparative Example 5 did not employ the basic compound (C), and the photoresist pattern formed by such negative photosensitive resin composition showed poor stripping property. By contrast, the negative photosensitive resin compositions in Embodiments 1 to 11 employed the basic compound (C). Since the basic compound (C) increased the solubility of the photoresist patterns, the photoresist patterns showed better stripping property.

The acrylate resin (A-1) used in the negative photosensitive resin composition in Comparative Example 4 did not contain the compound (a-1-2-1) with a tricyclodecane or dicyclopentadiene structure, or the compound (a-1-2-2) represented by formula (1). From the results, it is known that the photoresist pattern in Comparative Example 4 showed poor tolerance to the evaporation process and poor stripping property. By contrast, the negative photosensitive resin compositions in Embodiments 1 to 11 included the acrylate resin (A-1) containing the compound (a-1-2-1) with a tricyclodecane or dicyclopentadiene structure, the compound (a-1-2-2) represented by formula (1), or a combination of both. Since the compound (a-1-2-1) with a tricyclodecane or dicyclopentadiene structure and the compound (a-1-2-2) represented by formula (1) had an aliphatic ring structure, the heat resistance of the photoresist patterns was effectively enhanced. In addition, a compound having an aliphatic ring structure increases the glass transition temperature (Tg) of the acrylate resin (A-1) so as to prevent the photoresist pattern from damage in high temperature processes.

It is worth noting that the acrylate resin (A-1) in Synthesis Examples A-1-8 to A-1-11 contained the monomer (a-1-3) having a hydroxy group. Since the hydroxy group (—OH) in the monomer (a-1-3) having a hydroxy group increased the solubility of the photoresist patterns in the stripping liquid, the photoresist patterns in Embodiments 8 to 11 that employed the acrylate resin (A-1) in Synthesis Examples A-1-8 to A-1-11 showed especially good stripping property.

TABLE 5

| | Component | | 1 | 2 | 3 | 4 | 5 | 6 | 7 | 8 | 9 | 10 | 11 |
|---|---|---|---|---|---|---|---|---|---|---|---|---|---|
| Alkali-soluble resin (A) (part by weight) | A-1 | A-1-1 | 10 | — | — | — | — | — | — | — | — | — | — |
| | | A-1-2 | — | 20 | — | — | — | — | — | — | — | — | — |
| | | A-1-3 | — | — | 30 | — | — | 35 | — | — | — | — | — |
| | | A-1-4 | — | — | — | 40 | — | — | — | — | — | — | — |
| | | A-1-5 | — | — | — | — | 50 | — | — | — | — | — | — |
| | | A-1-6 | — | — | — | — | — | 35 | — | — | — | — | — |
| | | A-1-7 | — | — | — | — | — | — | 50 | — | — | — | — |
| | | A-1-8 | — | — | — | — | — | — | — | 20 | — | — | — |
| | | A-1-9 | — | — | — | — | — | — | — | — | 50 | — | — |
| | | A-1-10 | — | — | — | — | — | — | — | — | — | 70 | — |
| | | A-1-11 | — | — | — | — | — | — | — | — | — | — | 40 |
| | | A-1-12 | — | — | — | — | — | — | — | — | — | — | — |
| | A-2 | A-2-1 | 90 | — | — | — | 50 | — | — | 80 | — | — | — |
| | | A-2-2 | — | 40 | — | — | — | 30 | — | — | 50 | — | — |
| | | A-2-3 | — | 40 | 70 | — | — | — | 40 | — | — | 30 | — |
| | | A-2-4 | — | — | — | 60 | — | — | — | — | — | — | 50 |
| | | A-2-5 | — | — | — | — | — | — | — | — | — | — | — |
| | A-3 | A-3-1 | — | — | — | — | — | — | 10 | — | — | — | — |
| | | A-3-2 | — | — | — | — | — | — | — | — | — | — | 10 |
| Photoacid generator (B) (part by weight) | B-1 | | 0.5 | — | — | — | 2 | 4 | 4 | — | 5 | — | — |
| | B-2 | | — | 1 | — | 3 | 1 | — | — | 5 | — | 5.5 | — |
| | B-3 | | — | — | 2 | — | — | — | — | — | — | — | 6 |
| Basic compound (C) (part by weight) | C-1 | | 0.3 | — | — | — | — | 2 | 2 | — | — | — | — |
| | C-2 | | — | 0.5 | — | — | — | — | — | 2.5 | — | — | — |
| | C-3 | | — | — | 1 | — | — | — | — | — | 2.5 | — | — |
| | C-4 | | — | — | — | 1 | — | — | — | — | — | 3 | — |
| | C-5 | | — | — | — | 0.5 | 1.5 | — | — | — | — | — | 3 |
| Cross-linking agent (D) (part by weight) | D-1 | | 5 | — | — | 15 | 20 | — | — | 30 | 30 | — | — |
| | D-2 | | — | 10 | — | — | — | 20 | — | — | — | 20 | — |
| | D-3 | | — | — | 15 | — | — | — | 25 | — | — | 15 | 35 |
| Solvent (E) (part by weight) | E-1 | | 100 | — | 200 | 300 | — | — | 600 | 400 | 800 | — | — |
| | E-2 | | — | 200 | 100 | — | 400 | — | — | 300 | — | 800 | — |
| | E-3 | | — | — | — | 100 | 400 | 500 | — | — | — | — | 1000 |
| Additive (F) (part by weight) | F-1 | | — | — | — | 0.5 | — | — | — | — | — | — | — |
| | F-2 | | — | — | — | — | — | — | — | — | — | — | 2 |
| Results of evaluation | Stripping Property | | ○ | ○ | ○ | ○ | ○ | ○ | ○ | ◎ | ◎ | ◎ | ◎ |
| | Tolerance to Evaporation Process | | ○ | ○ | ○ | ○ | ○ | ○ | ○ | ○ | ○ | ○ | ○ | temperature processes. Therefore, the photoresist patterns in Embodiments 1 to 11 had good tolerance to the evaporation process and good stripping property.

The monomer of the novolac resin (A-2) used in the negative photosensitive resin composition in Comparative Example 6 did not contain the xylenol compound (a-2-2), and the photoresist pattern in Comparative Example 6 showed poor tolerance to the evaporation process and poor stripping property. By contrast, the monomers of the novolac resins (A-2) used in the negative photosensitive resin compositions in Embodiments 1 to 11 contained the xylenol compound (a-2-2). Since the xylenol compound (a-2-2) effectively enhanced the heat resistance of the novolac resin (A-2), the

TABLE 6

| | Component | | | Comparative Example | | | | | |
|---|---|---|---|---|---|---|---|---|---|
| | | | | 1 | 2 | 3 | 4 | 5 | 6 |
| Alkali-soluble Resin (A) (part by weight) | A-1 | A-1-1 | | — | — | — | — | — | 50 |
| | | A-1-2 | | — | — | — | — | 20 | — |
| | | A-1-3 | | — | — | — | — | — | — |
| | | A-1-4 | | — | — | — | — | — | — |
| | | A-1-5 | | — | 100 | — | — | — | — |
| | | A-1-6 | | — | — | — | — | — | — |
| | | A-1-7 | | — | — | — | — | — | — |
| | | A-1-8 | | — | — | — | — | — | — |
| | | A-1-9 | | — | — | — | — | — | — |

TABLE 6-continued

| | Component | Comparative Example 1 | 2 | 3 | 4 | 5 | 6 |
|---|---|---|---|---|---|---|---|
| | A-1-10 | — | — | — | — | — | — |
| | A-1-11 | — | — | — | — | — | — |
| | A-1-12 | — | — | — | 30 | — | — |
| A-2 | A-2-1 | — | — | — | — | — | — |
| | A-2-2 | 100 | — | — | — | 80 | — |
| | A-2-3 | — | — | — | 70 | — | — |
| | A-2-4 | — | — | — | — | — | — |
| | A-2-5 | — | — | — | — | — | 50 |
| A-3 | A-3-1 | — | — | 100 | — | — | — |
| | A-3-2 | — | — | — | — | — | — |
| Photoacid generator (B) (part by weight) | B-1 | — | — | 4 | — | — | — |
| | B-2 | 2 | 3 | — | — | 3 | — |
| | B-3 | — | — | — | 2 | — | 3 |
| Basic compound (C) (part by weight) | C-1 | — | — | 2 | — | — | — |
| | C-2 | 1 | — | — | — | — | — |
| | C-3 | — | — | — | 1 | — | 3 |
| | C-4 | — | — | — | — | — | — |
| | C-5 | — | 2 | — | — | — | — |
| Cross-linking agent (D) (part by weight) | D-1 | — | — | 30 | — | — | — |
| | D-2 | 25 | — | — | — | 10 | — |
| | D-3 | — | 25 | — | 15 | — | 25 |
| Solvent (E) (part by weight) | E-1 | — | — | — | 200 | — | — |
| | E-2 | 200 | 400 | — | 100 | 200 | — |
| | E-3 | — | — | 500 | — | — | 500 |
| Additive (F) (part by weight) | F-1 | — | — | — | — | — | — |
| | F-2 | — | — | — | — | — | — |
| Results of Evaluation | Stripping Property | X | X | X | Δ | X | Δ |
| | Tolerance to Evaporation Process | X | X | X | X | Δ | X |

In summary, the negative photosensitive resin composition of the invention includes the acrylate resin (A-1), the novolac resin (A-2), and the basic compound (C). The acrylate resin (A-1) includes a monomer including the compound (a-1-2-1) with a tricyclodecane or dicyclopentadiene structure, the compound (a-1-2-2) represented by formula (1), or a combination of both. The novolac resin (A-2) includes a monomer of a xylenol compound. Accordingly, conventional problems of photoresist patterns concerning poor stripping property with the substrate and poor tolerance to the evaporation process are solved. In the event that the acrylate resin (A-1) includes the monomer (a-1-3) having a hydroxy group, the photoresist pattern has especially good stripping property.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A negative photosensitive resin composition, comprising:
   an alkali-soluble resin (A);
   a photoacid generator (B);
   a basic compound (C);
   a cross-linking agent (D); and
   a solvent (E),
   wherein the alkali-soluble resin (A) comprises an acrylate resin (A-1) and a novolac resin (A-2);
   the acrylate resin (A-1) being synthesized by polymerizing a monomer for polymerization, the monomer for polymerization comprising an unsaturated carboxylic acid or unsaturated carboxylic acid anhydride monomer (a-1-1) and a monomer (a-1-2), the monomer (a-1-2) comprising a compound (a-1-2-1) with a tricyclodecane or dicyclopentadiene structure and a compound (a-1-2-2) represented by formula (1),

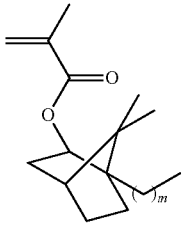

Formula (1)

wherein in formula (1), in is an integer of 0 to 2, and wherein based on 100 parts by weight of the monomer used in the polymerization of the acrylate resin (A-1), a used amount of the compound (a-1-2-1) with a tricyclodecane or dicyclopentadiene structure and the compound (a-1-2-2) represented by formula (1) is 10 to 60 parts by weight;

the novolac resin (A-2) being synthesized by polymerizing an aldehyde compound with an aromatic hydroxy compound, the aromatic hydroxy compound comprising a xylenol compound, and wherein based on a used amount of the aromatic hydroxy compound used in the polymerization of the novolac resin (A-2) being 1 mol, a used amount of the xylenol compound is 0.1 mol to 0.5 mol.

2. The negative photosensitive resin composition of claim 1, wherein the monomer for polymerization of the acrylate resin (A-1) further comprises a monomer (a-1-3) having a hydroxy group.

3. The negative photosensitive resin composition of claim 2, wherein based on 100 parts by weight of the monomer used in the polymerization of the acrylate resin (A-1), a used amount of the monomer (a-1-3) having a hydroxy group is 10 to 30 parts by weight.

4. The negative photosensitive resin composition of claim 1, wherein the photoacid generator (B) comprises an onium salt compound, a halogen-containing compound, a sulfone compound, a sulfonic acid compound, a sulfonimide compound, or a combination thereof.

5. The negative photosensitive resin composition of claim 1, wherein the basic compound (C) comprises an aliphatic primary amine, an aliphatic secondary amine, an aliphatic tertiary amine, an amino alcohol, an aromatic amine, a quaternary ammonium hydroxide, an alicyclic amine, or a combination thereof.

6. The negative photosensitive resin composition of claim 1, wherein based on 100 parts by weight of the alkali-soluble resin (A), a used amount of the photoacid generator (B) is 0.5 to 6 parts by weight, a used amount of the basic compound (C) is 0.3 to 3 parts by weight, a used amount of the cross-linking agent (D) is 5 to 35 parts by weight, and a used amount of the solvent (E) is 100 to 1000 parts by weight.

7. The negative photosensitive resin composition of claim 1, wherein based on a total used amount of the acrylate resin (A-1) and the novolac resin (A-2) being 100 parts by weight, a used amount of the acrylate resin (A-1) is 10 to 70 parts by weight, and a used amount of the novolac resin (A-2) is 30 to 90 parts by weight.

8. A method for forming a photoresist pattern, comprising:
coating a negative photosensitive resin composition according to claim 1 on a substrate; and
performing a processing step to the negative photosensitive resin composition so as to form a photoresist pattern.

9. The method for forming a photoresist pattern of claim 8, wherein the photoresist pattern is a rib.

10. A method for forming a metallic pattern, comprising:
forming a photoresist pattern on a substrate, wherein the photoresist pattern is formed by the method according to claim 8;
forming a metal layer on the substrate and on the photoresist pattern; and
removing the photoresist pattern and the metal layer on the photoresist pattern, so as to form a metallic pattern.

11. A method for fabricating a light emitting diode die, comprising:
forming a semiconductor layer on a substrate; and
forming a metallic pattern on at least one side of the semiconductor layer so that the metallic pattern serves as an electrode layer, wherein the metallic pattern is formed by the method according to claim 10.

12. A method for fabricating an organic light emitting diode display device, comprising:
forming a first electrode layer on a substrate;
coating a negative photosensitive resin composition according to claim 1 on the substrate; and
performing a processing step to the negative photosensitive resin composition so as to form a rib;
forming an organic layer within a region defined by the rib; and
forming a second electrode layer on the organic layer.

13. The negative photosensitive resin composition of claim 1, wherein based on 100 parts by weight of the alkali-soluble resin (A), a used amount of the photoacid generator (B) is 0.5 to 6 parts by weight, a used amount of the basic compound (C) is 0.3 to 3 parts by weight, a used amount of the cross-linking agent (D) is greater than 10 parts and less than or equal to 35 parts by weight, and a used amount of the solvent (E) is 100 to 1000 parts by weight.

\* \* \* \* \*